United States Patent [19]
Sloma et al.

[11] Patent Number: 5,641,995
[45] Date of Patent: Jun. 24, 1997

[54] ATTACHMENT OF CERAMIC CHIP CARRIERS TO PRINTED CIRCUIT BOARDS

[75] Inventors: Katrina Sloma; Martin L. Guth; Albert A. Yeh, all of Colorado Springs, Colo.

[73] Assignee: Hewlett-Packard Company, Palo Alto, Calif.

[21] Appl. No.: 408,364

[22] Filed: Mar. 22, 1995

[51] Int. Cl.$^6$ .............................. H01L 23/48; H01L 23/52
[52] U.S. Cl. .............................. 257/783; 257/690; 257/700
[58] Field of Search ................................ 257/690, 700, 257/783, 784, 702, 703, 779, 786

[56] References Cited

U.S. PATENT DOCUMENTS 5,218,234   6/1993   Thompson et al. ................ 257/792

FOREIGN PATENT DOCUMENTS

| 60-68638  | 4/1985  | Japan | 257/787 |
| 1-297828  | 11/1989 | Japan | 257/783 |
| 5-144995  | 6/1993  | Japan | 257/700 |
| 5-136286  | 6/1993  | Japan | 257/700 |

OTHER PUBLICATIONS

"Electronic Packaging and Interconnection Handbook", pp. 7.24–7.25, Harper.

Semiconductor International by Ron Iscoff, West Coast Editor, Will Hybrid Circuits Survive?, Oct. 1993 issue, pp. 56–59.

Electronic Materials Handbook — vol. 1 "Packaging" by ASM International, Materials Park, OH, 1989: 0-89170-285-1 at p. 205, 651–657.

Market Trends by E. Jan, Emerging Flip Chip Use, Fall 1993 issue, pp. 32–34.

Primary Examiner—Mahshid D. Saadat
Assistant Examiner—Jhihan B. Clark

[57] ABSTRACT

A leadless chip carrier is attached to a printed circuit board by soldering its input-output connections to the printed circuit board and also by providing an adhesive between a central portion of the leadless chip carrier and the printed circuit board. This adhesive provides increased mechanical strength to the connection, improving its tolerance to temperature cycling. The adhesive used may be the same solder used to make the input-output connections.

14 Claims, 3 Drawing Sheets

ATTACHMENT OF CERAMIC CHIP CARRIERS TO PRINTED CIRCUIT BOARDS

FIELD OF THE INVENTION

The present invention relates generally to hybrid circuits and more particularly to a hybrid circuit having a leadless chip carrier attached to a printed circuit board.

BACKGROUND OF THE INVENTION

Ceramic circuit boards or substrates are often used in the manufacture of electronic equipment due to their ruggedness and resistance to environmental extremes. For example, ceramic circuit boards are commonly used in the manufacture of hybrid circuits. Hybrid circuits are employed in a wide range of devices, such as electronic test equipment, computers, and electronic equipment for aircraft, just to name a few. Several other uses for ceramic hybrid circuits are shown and described in the October 1993 issue of *Semiconductor International* at page 56 in an article entitled "Will Hybrid Circuits Survive?", which is hereby specifically incorporated by reference for all that it discloses.

Hybrid circuits of the kind described above typically comprise a ceramic substrate to which are mounted a variety of integrated circuit chips. The various integrated circuit chips are electrically connected to one another by a plurality of conductive metallic traces (printed circuits) deposited directly on the substrate. In most cases, the substrate also includes passive electronic components, such as resistors and capacitors, required to make the circuit functional. The passive circuit elements are usually manufactured directly on the ceramic substrate by any number of well-known processes. Thick film screen printing is a common technique for forming circuit traces as well as passive electronic components of hybrid circuits.

It is also common to deposit a thin layer of metal on the back side of the substrate to act as a ground plane. The appropriate ground points on the conductive traces on the front side of the substrate are connected to this ground plane on the back side of the substrate by electrically conductive holes, also commonly referred to as vias.

Once manufactured, a ceramic circuit board is usually attached to a larger printed circuit board which may host a number of ceramic circuit boards having various functions. The printed circuit board electrically connects the ceramic circuit boards with each other and with other electronic components and circuits as necessary depending upon the requirements of the particular electronic device employing the circuit.

Printed circuit boards are usually constructed of an insulating epoxy-glass material in a well-known manner. Electrically conductive paths are provided on and within the printed circuit board to accomplish the necessary connections. Electrically conductive receptor sites are also provided for connecting with corresponding interconnect sites on the ceramic circuit boards.

This connection between the printed circuit board receptor sites and the ceramic circuit board interconnect sites represents a potential source of failures in electronic devices. Because the epoxy-glass printed circuit board material has a different coefficient of thermal expansion than the ceramic material of the ceramic circuit board, temperature cycling results in relative movement between the printed circuit board and the ceramic circuit board. Such relative movement produces stress in the connection, which usually consists of a soldered joint. Eventually, this stress will cause failure of the soldered connection, resulting in electrical discontinuity and thus failure of the electronic device.

One way of addressing this problem has been to provide compliant leads on the ceramic circuit board. These leads are soldered to the printed circuit board connection sites. Because the leads are flexible, they serve to absorb the relative movement between the printed circuit board and the ceramic circuit board. This type of ceramic circuit board is sometimes referred to as a "leaded chip carrier".

Although leaded chip carriers absorb relative movement induced by temperature cycling, they are relatively expensive to manufacture. They are also relatively bulky due to the length of the leads employed.

A more compact and economical carrier is known as a "leadless chip carrier". Leadless chip carriers are generally mounted directly to a printed circuit board. Instead of leads, these carriers have interconnect pads around the periphery of the carrier, see FIG. 1. These pads are then soldered directly to the printed circuit board receptor sites.

The soldering process generally entails the application of a metalized solder paste to the surface of the printed circuit board in locations where a solder connection is desired. Accordingly, the receptor sites on the printed circuit board would be coated with the solder paste. The ceramic circuit board, along with other desired components, are then placed on the printed circuit board at the appropriate locations. The entire package is then heated to the melting point of the solder material in order to accomplish a soldered bond in the desired locations.

Because leadless chip carriers are connected directly to printed circuit boards, they are particularly susceptible to thermal cycling induced failures as described above. This is particularly true for large area leadless chip carriers which are often required due to the complexity of the circuit being supported by the carrier.

Because of this thermal cycling problem, leadless chip carriers having areas of about 0.650 square inches and larger tend to be unreliable. For larger sizes, the more expensive and bulky leaded chip carriers are generally employed to ensure reliability of the circuit. This size related problem of leadless chip carriers is well recognized in the industry. See, for example, ELECTRONIC MATERIALS HANDBOOK—Volume 1 "Packaging" by ASM International, Materials Park, OH., 1989 ISBN: 0-89170-285-1 at page 205, which is hereby specifically incorporated by reference for all that it discloses.

Consequently, there is a need to address this thermal cycling problem to enable the reliable usage of larger area leadless chip carriers and to improve the reliability of smaller area leadless chip carriers.

SUMMARY OF THE INVENTION

Accordingly, it is an object of this invention to address the thermal cycling problem described above in order to enable the reliable usage of large area leadless chip carriers and to improve the reliability of smaller area leadless chip carriers.

To achieve this, an adhesive is applied between the lower surface of the leadless chip carrier and the printed circuit board. The adhesive provides a bond between the leadless chip carrier and the printed circuit board and thus acts to restrict the relative movement induced by changes in temperature. In this manner, the solder joints are protected from the stress that would otherwise be induced by such relative movement.

The adhesive may be the same type of solder material used to attach the printed circuit board connection sites to the leadless chip carrier interconnect pads. In this manner, the soldering step previously described will, at one time, cause bonding of all of the required connections between the printed circuit board and the leadless chip carrier.

The lower surface of the leadless chip carrier may be provided with a conductive backplane which may be used as a common ground for portions of the circuit located on the top of the leadless chip carrier. The back plane is electrically isolated from at least some of the leadless chip carrier interconnect pads.

The adhesive may be applied to the entire lower surface of the leadless chip carrier or to only a portion of it. Although adhesive applied to a larger surface area results in greater bonding strength, the addition of any amount of adhesive between the leadless chip carrier lower surface and the printed circuit board will result in improved reliability of the connection.

The adhesive also beneficially impacts the performance of leadless chip carrier circuits by providing an additional path of thermal conductivity between the leadless chip carrier and the printed circuit board. Circuits mounted on leadless chip carriers often generate heat that is detrimental to their performance. The addition of an adhesive enhances the dissipation of heat from the leadless chip carrier into the printed circuit board and thus enhances the performance of the circuit.

DETAILED DESCRIPTION OF THE INVENTION

Figure 1:
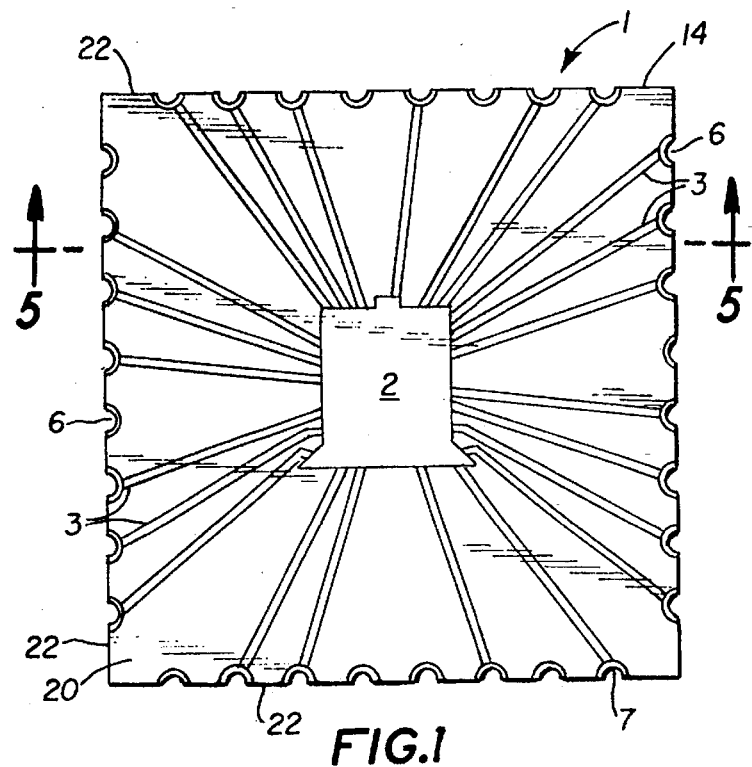
FIG. 1 is a top plan view of a leadless chip carrier used in the assembly of FIG. 8.
Figure 2:
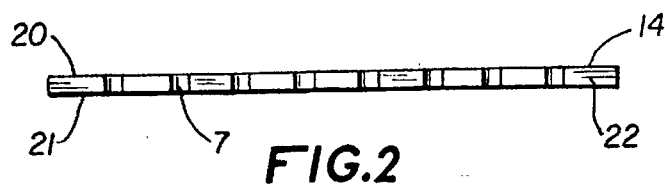
FIG. 2 is a front elevation view of the leadless chip carrier of FIG. 1.
Figure 3:
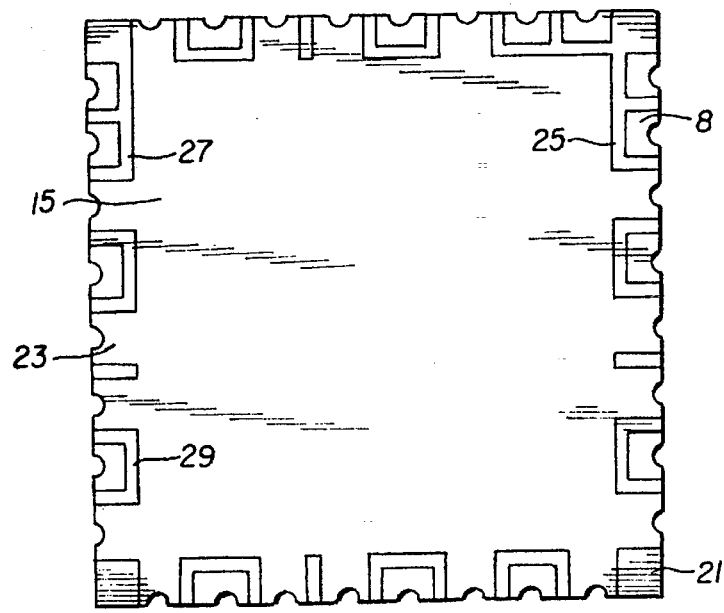
FIG. 3 is a bottom plan view of the leadless chip carrier of FIG. 1.

FIGS. 1–3 and 8 illustrate a portion of an electronic circuit comprising a substrate 14 having a first surface 20 and a second surface 21. An electronic circuit 2 is located on the first surface 20, FIG. 1. A plurality of connection sites 8, FIG. 3, are located at the periphery of the second surface 21. These connection sites 8 are electrically connected with at least portions of the electronic circuit 2. A printed circuit board 10, FIGS. 4 and 8, has a plurality of receptor sites 12 located thereon. The connection sites 8 are electrically connected to the receptor sites 12. An adhesive 19 is bonded to both the printed circuit board 10 and the second surface 21 of the substrate 14.

Having thus described the circuit connection in general, it will now be described in further detail. FIG. 1 shows a leadless chip carrier 1 which generally includes a substrate 14 which is commonly constructed of a ceramic or glass material. A circuit device 2 which may be, for example, a pre-amplifier circuit shown schematically in FIG. 1. Circuit device 2 is located on an upper surface 20 of substrate 14 in a manner that is well-known. Ceramic substrate 14 may be provided with castellations 6 arranged around the periphery of the upper surface 20.

The castellations 6 comprise indentations in the side walls 22 of ceramic substrate 14. These indentations extend through ceramic substrate 14 to the lower surface 21 as shown in FIGS. 1–3. Arranged around the periphery of each castellation on upper surface 20 is a transversely extending conductor 7. As is well-known, this transversely extending conductor 7 may be formed of a thick film metallic substance such as palladium silver or platinum palladium silver or any other metallic substance that is suitable for applying solder thereto.

First surface traces 3 serve to electrically connect the circuit device 2 with at least some of the transversely extending conductors 7. The transversely extending conductors 7 extend downwardly through the castellations 6 to connect with interconnect pads 8 which are located along the periphery of the lower surface 21 of ceramic substrate 14. In this manner, an electrical connection is established between the circuit device 2 on the upper surface 20 of ceramic substrate 14 and the interconnect pads 8 on the lower surface 21 of ceramic substrate 14.

A back plane 15 may be provided on the lower surface 21 of the ceramic substrate 14 interiorly of the interconnect pads 8 as shown in FIG. 3. This back plane 15 may serve as a ground for the leadless chip carrier. Accordingly, back plane 15 may be electrically connected to some of the interconnect pads as illustrated, for example, to interconnect pad 23. The backplane 15 is also electrically insulated from at least some of the interconnect pads as illustrated, for example, from interconnect pad 8 in FIG. 3. This insulation is accomplished by providing spaces between the backplane 15 material and the insulated interconnect pads as illustrated, for example, by the spaces 25, 27 and 29 in FIG. 3.

For grounding purposes, back plane 15 may also be connected directly to portions of the circuit device 2 by holes or vias (not shown) extending through the ceramic substrate 14.

Back plane 15 and the interconnect pads 8 may all be constructed of the same thick-film metallic substance described above for use in the transversely extending conductors 7. As previously mentioned, this material must be suitable for having a solder material applied to it. This means that the material selected must be capable of being wetted by the solder. The material must also, however, not be soluble in the solder. For example, the back plane and interconnect pads could be formed from palladium silver and the solder could be a 63/37 tin-lead (67% tin, 37% lead) eutectic type solder.

Figure 4:
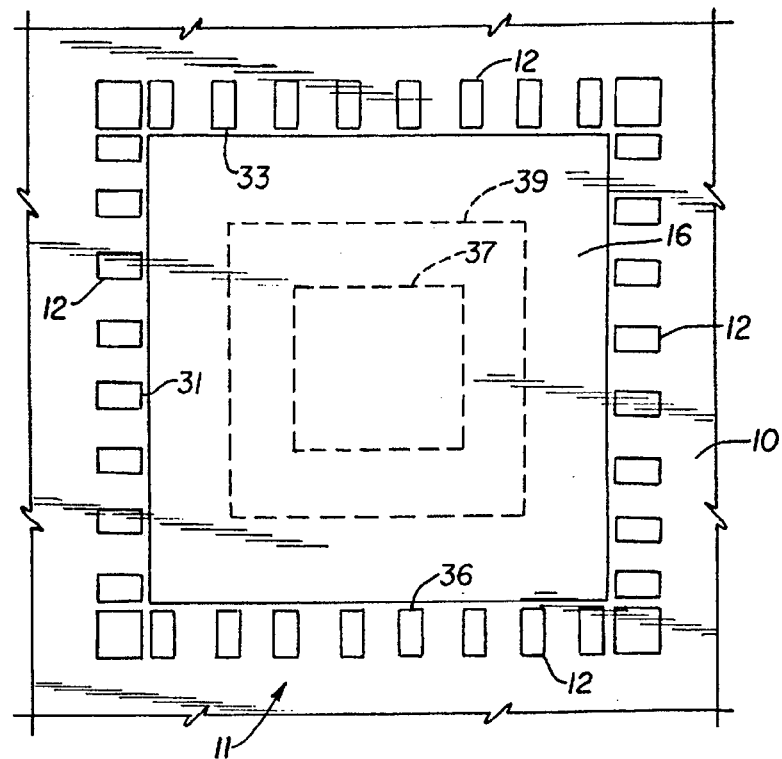
FIG. 4 is top plan view of a connection site on a printed circuit board.

FIG. 4 shows a portion of a printed circuit board 10 of the type that is suitable for having a leadless chip carrier mounted thereon. Printed circuit board 10 may be constructed of an insulating epoxy-glass material in a well-known manner.

Printed circuit board 10 includes a leadless chip carrier receptor site 11 for receiving a leadless chip carrier such as the leadless chip carrier 1 previously described. Receptor site 11 includes connection sites 12 arranged along the outside periphery thereof. A central area 16 is located interiorly of the connection sites 12 as shown.

The connection sites 12 are designed to spatially correspond to the location of the interconnect pads of a specific leadless chip carrier such as the interconnect pads 8 of the leadless chip carrier 1 previously described when the leadless chip carrier 1 is mounted on the printed circuit board 10. Connection sites 12 are formed of a material that is suitable for having solder applied thereto.

The connection sites 12 are connected to electrical conductors (not shown) within the printed circuit board which provide electrical continuity with other chip carrying devices and with other electronic components and circuits located on the printed circuit board as necessary depending upon the requirements of the particular electronic device employing the printed circuit board.

In a previously known method of attachment, a solder paste may be applied to the areas of printed circuit board 10 where connection is desired. The solder paste may be applied in any well-known manner for the application of such solder, such as by a conventional stencil printing procedure.

Accordingly, solder paste may be applied to the connection sites 12 of receptor site 11. After application of the solder paste, the leadless chip carrier 1 and the other printed circuit board components are placed on the printed circuit board 10 in their appropriate locations. The entire assembly is then heated in an oven to a temperature approximately equal to the melting point of the solder paste.

As the solder melts, it adheres to both the connection sites 12 of the printed circuit board 10 and the interconnect pads 8 of the leadless chip carrier. The melted solder also flows or wicks into the castellations 6 of the leadless chip carrier 1 and adheres to the transversely extending conductors 7.

The attachment method described above results in the leadless chip carrier 1 being mechanically connected to the printed circuit board 10 only by the solder applied between the connection sites 12 of the printed circuit board 10 and the interconnect pads 8 of the leadless chip carrier 1.

Figure 5:
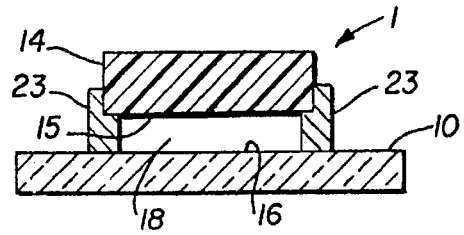
FIG. 5 is schematic cross section taken on the line 5—5 of FIG. 1 of a leadless chip carrier attached to a printed circuit board.

This connection is schematically illustrated in FIG. 5. As can be seen, leadless chip carrier 1 is attached to printed circuit board 10 by solder connections 23 (only two of which can be seen in FIG. 5). A space 18 is left between the back plane 15 of the leadless chip carrier 1 and the central area 16 of the printed circuit board receptor site 11. This space is, most likely, the result of the surface tension of the solder when molten.

Because of differences in the temperature coefficient of expansion (TCE) between the ceramic substrate 14 and the printed circuit board 10, this connection is susceptible to damage when exposed to changes in temperature. A material commonly used for ceramic substrate 14 is a 96% $Al_2O_3$ ceramic which has a TCE of between approximately 5 and 7 ppm per degree C. An epoxy-glass material commonly used to construct printed circuit board 10 is a fire retardant epoxy-glass cloth material which has a TCE of between approximately 12 and 16 ppm per degree C. The epoxy-glass material of the printed circuit board 10 will, thus, expand and contract to a greater extent than will the ceramic material of leadless chip carrier 1 when subjected to changes in temperature.

The difference in TCE between the two materials causes relative movement between the leadless chip carrier 1 and the printed circuit board 10 when temperature changes are experienced. This relative movement creates stress in the solder connections 23. Repeated temperature cycles thus result in stressing of these connections, and will ultimately result in failure of the connection.

FIG. 5 schematically illustrates the connection between the leadless chip carrier 1 and the printed circuit board 10 at a moderate temperature. As can be seen from FIG. 5, there is little if any relative movement between leadless chip carrier 1 and printed circuit 10 at this temperature.

Figure 6:
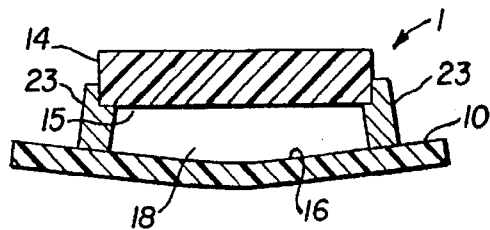
FIG. 6 is schematic cross section taken on the line 5—5 of FIG. 1 of a leadless chip carrier attached to a printed circuit board illustrating an effect of mismatch between coefficients of thermal expansion.

FIG. 6 schematically illustrates the connection between the leadless chip carrier 1 and the printed circuit board 10 at an elevated temperature. As can be seen from FIG. 6, the printed circuit board 10 has expanded to a greater extent than has the leadless chip carrier 1 due to the TCE differential previously described. This differential expansion causes relative movement between the leadless chip carrier 1 and the printed circuit board 10 thus resulting in stress on the solder connections 23 as shown.

Figure 7:
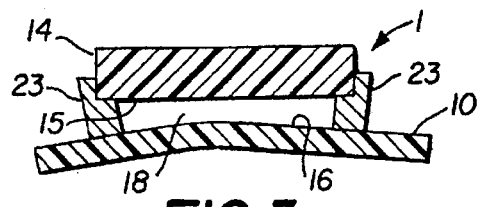
FIG. 7 is schematic cross section taken on the line 5—5 of FIG. 1 of a leadless chip carrier attached to a printed circuit board illustrating another effect of mismatch between coefficients of thermal expansion.

FIG. 7 schematically illustrates the connection between the leadless chip carrier 1 and the printed circuit board 10 at a low temperature. As can be seen from FIG. 7, the printed circuit board 10 has contracted to a greater extent than has the leadless chip carrier 1 due to the TCE differential. Once again, this differential expansion causes relative movement between the leadless chip carrier 1 and the printed circuit board 10 thus resulting in stress on the solder connections 23 as shown. It is noted that the relative expansions depicted in FIGS. 5-7 have been greatly exaggerated for purposes of illustration.

As can be appreciated, repeated cycling of temperatures from hot to cold and vice versa will result in repeated stressing of the solder connections 23. This stressing eventually leads to failure of the solder connections 23. As has been previously described, this temperature effect is more pronounced in larger area leadless chip carrier applications since these will experience greater differential expansion than will smaller leadless chip carrier applications. The temperature effect still, however, impacts the reliability of the smaller area leadless chip carriers to some extent.

Figure 8:
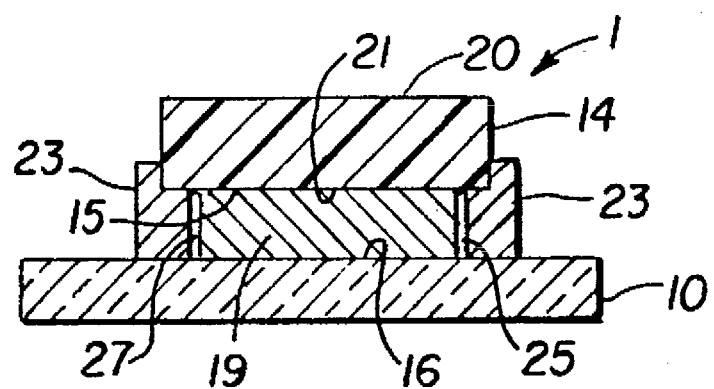
FIG. 8 is a schematic cross section taken on the line 5—5 of FIG. 1 of a leadless chip carrier having its back plane bonded to a printed circuit board.

To obviate the above problem, a leadless chip carrier-to-printed circuit board connection has been developed which employs an adhesive 19 that effectively bonds the back plane 15 of the leadless chip carrier to the central area 16 of the printed circuit board receptor site 11, FIG. 8.

The adhesive, located in this manner, increases the mechanical strength of the connection between the leadless chip carrier 1 and the printed circuit board 10. This increased mechanical strength serves to resist relative movement between the leadless chip carrier 1 and the printed circuit board 10 that is induced by temperature changes. Reducing this relative movement greatly reduces the stress experienced by the solder connections 23 and thus improves the reliability of the connection.

In one alternative embodiment of the invention, the adhesive employed may be a solder material and may, in fact, be the same solder paste used to accomplish the connection between the connection sites 12 and the interconnect pads 8 as described above. Using such a solder paste is particularly efficient since, in most conventional methods, it is applied to the circuit board to accomplish the electrical connection between the connection sites 12 and the interconnect pads 8 as previously described.

To accomplish this, the solder paste may be applied to central area 16 at the same time it is applied to the other standard connection sites on the printed circuit board 10.

The central area 16 may be coated with a metalized layer in order to provide good bonding with the solder. When the assembly is then heated, the solder applied to central area 16 will melt, reflow and adhere to both central area 16 and to the lower surface 21 of the leadless chip carrier 1. The central area 16 is electrically insulated from the connection sites 12 by spaces as illustrated, for example, by the spaces 31, 33 and 35 in FIG. 4. These spaces serve as "solder dams", preventing the reflowed solder from bridging the gap between the metalized central area 16 and the connection sites 12. In areas where the leadless chip carrier backplane 15 is attached to an interconnect pad (such as interconnect pad 23, FIG. 3), however, reflowed solder will follow the backplane material thus bridging the gap between the central area 16 and the selected connection site 12 and interconnect pad 23. In areas where leadless chip carrier backplane 15 is not attached to an interconnect pad (such as interconnect pad 8, FIG. 3), the central area 16 will remain electrically insulated from the selected connection site 12 and interconnect pad 8. In this manner, the adhesive, in this embodiment solder, will remain electrically insulated from at least some of the connection sites 12 and interconnect pads 8.

This solder may be used with a leadless chip carrier having a back plane such as the back plane 15 described above. It is only necessary that the solder selected be capable of reliably adhering to the lower surface of the ceramic substrate 14 and the central area 16 of the printed circuit board receptor site 11.

One example of a specific method for applying this solder is carried out as follows. First, a printed circuit board is prepared by depositing a metallic coating on the central area 16 of the leadless chip carrier receptor site 11. This coating may be the same material applied in the same manner as the metal layer applied to the printed circuit board connection sites 12, as is well-known.

Next, a solder paste, such as a 63/37 tin-lead (67% tin, 37% lead) eutectic solder paste is applied to the printed circuit board connection sites 12 and to the central area 16 of leadless chip carrier receptor site 11. Such a solder paste is commercially available from Qualitek International, Inc., 315 Fairbank Street, Addison, Ill. 60101, sold under the trademark "Delta".

The solder paste may be applied using a conventional stencil printing technique as will be described. A stencil is first placed on the printed circuit board 10. The stencil has holes through which the solder paste can pass in the areas where it is to be applied to the board (e.g., the connection sites 12 and the central area 16). The solder paste is then applied on top of the stencil and a squeegee is used to push the solder paste across the stencil. The pressure provided by the squeegee causes some of the solder paste to pass through the stencil holes and adhere to the underlying printed circuit board in the desired areas. Excess solder paste is removed by the squeegee. The solder may be applied in a thickness range from about 0.008 inches to about 0.010 inches.

Examples of other solder pastes and stencil printing methods for applying solder paste are described in ELECTRONIC MATERIALS HANDBOOK—Volume 1 "Packaging" by ASM International, Materials Park, Ohio., 1989 ISBN: 0-89170-285-1 at pages 651–657, which is hereby specifically incorporated by reference for all that it discloses.

The stencil is then removed and the leadless chip carrier, along with any other desired components are attached to the printed circuit board in the appropriate locations while the solder paste is still wet. This attachment may be done by hand or by a robotic machine commonly referred to as a "pick and place" machine as is well-known.

After attaching the components, the assembly is placed into a drying oven to dry the solder paste. The drying oven is generally operated at a temperature of about 90 degrees celsius. The drying process is ordinarily completed after about 1 hour in the drying oven.

After drying, the assembly is placed onto the conveyor of a convection reflow oven. The conveyor moves the assembly into the oven where it is heated to a temperature of about 224 degrees, celsius. At this temperature, the solder reflows and adheres to the connection sites 12 of the printed circuit board and to the interconnect pads 8 of the leadless chip carrier. At this temperature, the solder also reflows to adhere to the backplane 15 of the leadless chip carrier 1 and the central area 16 of the printed circuit board receptor site 10 to accomplish the mechanical bonding previously described.

Although a stencil-printing method for applying solder has been described above, other well-known methods could alternatively be used. For example, the solder paste could be applied using a conventional dispensing process rather than a stencil process. As a further example, a solder preform, rather than a solder paste could alternatively be used as is well-known.

The use of an adhesive as described above greatly increases the life of the connection between a leadless chip carrier and a printed circuit board which is exposed to temperature cycling. The following table sets forth the results of temperature cycling experiments performed by applicants for 1.5625 square inch and 0.2500 square inch samples of leadless chip carriers mounted on printed circuit boards.

| Column | A | B | C | D |
| --- | --- | --- | --- | --- |
| Size | 1.25 | 0.50 | 1.25 | 0.50 |
| Backplane Soldered? | YES | YES | NO | NO |
| Cycles to Failure: | 1106 | 910 | 48 | 319 |
|  | 1154 | 1130 | 48 | 335 |
|  | 1202 | 1346 | 48 | 399 |
|  | 1202 | 1442 | 48 | 399 |
|  | 1298 | 1489 | 48 | 399 |
|  | 1346 | 1521 | 48 | 399 |
|  | 1346 | 1585 | 48 | 399 |
|  | 1394 | 1649 | 48 | 399 |
|  | 1442 | 1761 | 48 | 431 |
|  | 1585 | 1793 | 48 | 431 |
|  | 1617 | 1793 | 48 | 431 |
|  | 1617 | 1809 | 48 | 431 |
|  | 1617 | 1937 | 48 | 431 |
|  | 1649 | 1937 | 48 | 431 |
|  | 1649 | 1969 | 48 | 431 |
|  | 1681 | 2001 | 48 | 495 |
|  | 1713 | 2001 | 48 | 495 |
|  | 1841 | 2065 | 48 | 495 |
|  | 1873 | 2065 | 48 | 495 |
|  | 1873 | 2083 | 48 | 495 |
|  | 1905 | 2115 | 48 | 495 |
|  | 1905 | 2211 | 48 | 495 |
|  | 1937 | 2211 | 48 | 495 |
|  | 1937 | 2227 | 48 | 495 |
|  | 1937 | 2366 | 48 | 495 |
|  | 2065 | 2366 | 48 | 495 |
|  | 2227 | 2462 | 48 | 527 |
|  |  |  | 48 | 527 |
|  |  |  | 79 | 527 |
|  |  |  | 79 | 575 |

Columns A and B represent data produced by square leadless chip carriers mounted to printed circuit boards using a solder adhesive applied according to the method described above. Column A represents a leadless chip carrier having an area of approximately 1.5625 square inches (1.25 inches per side). Column B represents a leadless chip carrier having an area of approximately 0.2500 square inches (0.50 inches per side). The leadless chip carriers used were provided with back planes similar to the back plane 15 described previously. Enough adhesive solder was supplied to substantially cover all of the back plane of the leadless chip carrier.

The leadless chip carriers used to generate the data in columns C and D were identical in size and construction to the leadless chip carriers used to generate the data in columns A and B, respectively. These leadless chip carriers were, however, mounted in the conventional manner, in which no central adhesive is used.

To generate the data, the leadless chip carriers were exposed to a number of temperature cycles. For each cycle, the temperature was raised from −40 degrees celsius to +85 degrees celsius and then back to −40 degrees celsius. The numbers in the table represent the number of cycles experienced before a particular chip connection failed.

Column A represents the results of twenty-seven chip connection samples that were tested to failure. The average number of cycles to failure for this group is 1634. Column C represents the results of thirty samples that were tested to failure. The average number of cycles to failure for the Column C group is about 50. The Column C chips are the same size as the Column A chips, but lacked the soldered back plane used for the Column A chips.

Column B represents the results of twenty-seven samples that were tested to failure. The average number of cycles to failure for this group is about 1861. Column D represents the results of thirty samples that were tested to failure. The average number of cycles to failure for the Column C group is about 456. The Column C chips are the same size as the Column A chips, but lack the soldered back plane used for the Column A chips.

As can be seen from the table, the use of a solder adhesive between the lower surface 21 of leadless chip carrier 1 and the central area 16 of the printed circuit board receptor site 11 greatly improves the number of temperature cycles to failure.

Although the data in columns A and B was generated using enough solder to substantially cover all of back plane 15, it should be appreciated that any amount of solder or other adhesive used would increase the reliability of the connection by adding mechanical strength. Covering an area greater than about 25% of the total area of lower surface 21, for example, will provide added strength to the connection. Such an area is schematically illustrated by broken lines 37 in FIG. 4. Covering an area greater than 50% will provide significantly added strength. Such an area is schematically illustrated by broken lines 39 in FIG. 4.

Although the procedure outlined above has been described with respect to the use of a solder, any acceptable adhesive such as a conductive or nonconductive epoxy presented as either a paste or a preform may be used. Such an adhesive should be applied in a thickness no greater than the thickness of the solder paste used to electrically connect the leadless chip carrier connection sites 8 to the printed circuit board receptor sites 12. If the adhesive is thicker, it may prevent the connection sites 8 from contacting the solder paste applied to the receptor sites 12 and thus interfere with reliable electrical connection.

This adhesive may be used with a leadless chip carrier having a back plane such as the back plane 15 described above or with a leadless chip carrier of the type that lacks such a back plane. It is only necessary that the adhesive selected be capable of reliably adhering to the lower surface of the ceramic substrate 14 and the central area 16 of the printed circuit board receptor site 11.

If a backplane is used with an adhesive other than solder, as described above, the backplane material need not be capable of being wetted by solder as previously described. It is only necessary that the backplane material selected be capable of forming an adequate bond with the adhesive material selected.

This adhesive may be applied before, after or concurrently with a solder paste as described above. The adhesive applied in this manner will tend to hold the leadless chip carrier 1 in place on the printed circuit board receptor site 11 while the assembly is heated to accomplish melting of the solder. In general, the adhesive may be applied at any time prior to placing the leadless chip carrier onto the printed circuit board. The adhesive may be cured during the solder reflow process discussed above, or as a separate step. The adhesive may be applied to either the lower surface 21 of the leadless chip carrier 1 or to the central area 16 of the printed circuit board receptor site 11, or to both.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. An electronic circuit device comprising:

a substrate having a first surface and a second surface;

an electronic circuit located on said first surface;

a plurality of connection sites located at the periphery of said second surface, said connection sites being electrically connected with at least portions of said electronic circuit;

a printed circuit board having a plurality of receptor sites located thereon;

said connection sites being electrically connected to said receptor sites;

said substrate being substantially immovably attached to said printed circuit board by an adhesive which is bonded to both said printed circuit board and said second surface of said substrate; and wherein said adhesive is spaced from at least one of said receptor sites.

2. The electronic circuit device of claim 1 wherein said adhesive is electrically insulated from at least one of said connection sites.

3. The electronic circuit device of claim 1 wherein said adhesive covers at least 25% of the surface area of the second surface of said substrate.

4. The electronic circuit device of claim 1 wherein said adhesive covers at least 50% of the surface area of the second surface of said substrate.

5. The electronic circuit device of claim 1 wherein said adhesive covers substantially all of the second surface of said substrate.

6. The electronic circuit device of claim 1 wherein said adhesive comprises a solder.

7. The electronic circuit device of claim 1 wherein said adhesive is an electrically conductive adhesive.

8. An electronic circuit device having at least one chip carrier device mounted on a printed circuit board comprising:

a plurality of receptor sites located on said printed circuit board;

said chip carrier device having a first surface and a second surface;

an electronic circuit located on said first surface;

a plurality of connection sites located at the periphery of said second surface, said connection sites being electrically connected with at least portions of said electronic circuit and with at least one of said receptor sites of said printed circuit board;

a central area of said second surface located substantially interiorly of said connection sites;

said chip carrier device being substantially immovably attached to said printed circuit board by an adhesive which is bonded to both said central area of said chip carrier device and said printed circuit board; and wherein said adhesive is spaced from at least one of said receptor sites.

9. The electronic circuit device of claim 8 wherein said central area comprises a conductive back plane.

10. The electronic circuit device of claim 8 wherein said adhesive covers at least 25% of said central area.

11. The electronic circuit device of claim 8 wherein said adhesive covers at least 50% of said central area.

12. The electronic circuit device of claim 8 wherein said adhesive covers substantially all of said central area.

13. The electronic circuit device of claim 8 wherein said adhesive comprises a solder material.

14. The electronic circuit device of claim 8 wherein said adhesive is an electrically conductive adhesive.

* * * * *